(12) United States Patent
Okazaki et al.

(10) Patent No.: US 10,298,145 B2
(45) Date of Patent: May 21, 2019

(54) POWER CONVERTER CAPABLE OF CONVERTING DIRECT-CURRENT ELECTRIC POWER OR THREE-PHASE ALTERNATING-CURRENT POWER

(71) Applicant: CALSONIC KANSEI CORPORATION, Saitama-shi, Saitama (JP)

(72) Inventors: Fumihiro Okazaki, Saitama (JP); Gen Okuzuka, Saitama (JP); Yuuichirou Nomura, Saitama (JP); Masaharu Nagano, Saitama (JP)

(73) Assignee: CALSONIC KANSEI CORPORATION, Saitama-shi (JP)

( * ) Notice: Subject to any disclaimer, the term of this patent is extended or adjusted under 35 U.S.C. 154(b) by 0 days.

(21) Appl. No.: 15/575,060

(22) PCT Filed: May 17, 2016

(86) PCT No.: PCT/JP2016/064550
§ 371 (c)(1),
(2) Date: Jan. 3, 2018

(87) PCT Pub. No.: WO2016/186095
PCT Pub. Date: Nov. 24, 2016

(65) Prior Publication Data
US 2018/0262122 A1    Sep. 13, 2018

(30) Foreign Application Priority Data

May 18, 2015   (JP) ................. 2015-101089
Apr. 27, 2016  (JP) ................. 2016-089224

(51) Int. Cl.
*H02M 7/48*    (2007.01)
*H02M 7/00*    (2006.01)
(Continued)

(52) U.S. Cl.
CPC .............. *H02M 7/48* (2013.01); *B60R 16/02* (2013.01); *H02M 7/003* (2013.01); *H05K 7/209* (2013.01);
(Continued)

(58) Field of Classification Search
CPC .......... H02M 7/003; H02M 7/48; H02M 1/14; H01M 2/10; H01M 2/20; H01G 4/005;
(Continued)

(56) References Cited

U.S. PATENT DOCUMENTS

2010/0211242 A1* 8/2010 Kelty ............... B60K 6/46
                                                        701/22
2010/0262322 A1* 10/2010 Yokouchi ......... B60K 6/26
                                                        701/22
(Continued)

FOREIGN PATENT DOCUMENTS

JP    H09-126617 A    5/1997
JP    2002-095267 A   3/2002
(Continued)

*Primary Examiner* — Yemane Mehari
(74) *Attorney, Agent, or Firm* — Foley & Lardner LLP (57) ABSTRACT

A power converter 1 includes: a power module 20 that converts direct-current electric power to three-phase alternating-current electrical power and outputs the three-phase alternating-current electrical power from three-phase terminals; an output bus bar 24 that has motor terminals 26 and a plurality of power module terminals 25 that are connected to the power module 20; a bus bar holder 23 holding the output bus bar 24; and a case 2 that has a through hole 3 through which the output bus bar 24 penetrates and that accommodates the power module 20, the output bus bar 24, and the bus bar holder 23. The three-phase terminals are arranged side-by-side on the power module 20. The plurality of power module terminals 25 are respectively formed on the output bus bar 24 so as to correspond to the three-phase terminals, and the plurality of power module terminals 25 are positioned on the three-phase terminals when the output bus bar 24 and the power module 20 are accommodated in the case 2.

18 Claims, 11 Drawing Sheets

(51) Int. Cl.
  *B60R 16/02* (2006.01)
  *H05K 7/20* (2006.01)
(52) U.S. Cl.
  CPC ....... *B60L 2210/10* (2013.01); *B60L 2240/36* (2013.01); *B60L 2240/525* (2013.01)
(58) Field of Classification Search
  CPC ...... H01G 4/228; H01G 4/40; Y02T 10/7005; Y02T 10/7022; Y02T 10/7216; B60R 16/02; B60L 9/18; B60L 11/18; B60L 11/223; B60L 2210/10; B60L 3/003
  USPC .............................. 363/15–17, 21.01–21.18
  See application file for complete search history.

(56) References Cited

U.S. PATENT DOCUMENTS

| | | | | |
|---|---|---|---|---|
| 2011/0116235 | A1* | 5/2011 | Ryu | B60L 3/00 |
| | | | | 361/699 |
| 2014/0098588 | A1* | 4/2014 | Kaneko | H02M 7/003 |
| | | | | 363/141 |
| 2014/0313806 | A1* | 10/2014 | Shinohara | H05K 7/20927 |
| | | | | 363/141 |

FOREIGN PATENT DOCUMENTS

| | | |
|---|---|---|
| JP | 3172122 U | 11/2011 |
| JP | 2013-233052 A | 11/2013 |
| JP | 2014-087124 A | 5/2014 |
| JP | 2014-113053 A | 6/2014 |
| WO | WO-2013/080665 A1 | 6/2013 |

* cited by examiner

POWER CONVERTER CAPABLE OF CONVERTING DIRECT-CURRENT ELECTRIC POWER OR THREE-PHASE ALTERNATING-CURRENT POWER

TECHNICAL FIELD

The present invention relates to a power converter mounted on electric automobiles, hybrid automobiles, and so forth.

BACKGROUND ART

JP2013-233052A discloses an inverter device arranged above a driving motor generator in electric automobiles, hybrid automobiles, and so forth. This inverter device supplies battery electrical power to the motor generator and is provided with a power module for charging a battery with regenerative electrical power from the motor generator and three alternating-current bus bars for connecting the motor generator to the power module. The three alternating-current bus bars are provided so as to project out to the outside of a housing through an opening.

SUMMARY OF INVENTION

However, with the inverter device according to JP2013-233052A, the three alternating-current bus bars need to be respectively assembled one by one by welding, etc. to terminals of the inverter device having complex configuration, and it is difficult to improve workability upon assembly.

The present invention has been conceived in light of the problems mentioned above, and an object thereof is to improve workability upon assembly of a power converter.

According to one aspect of the present invention, a power converter includes a power module configured to convert direct-current electric power to three-phase alternating-current electrical power, the power module being configured to output the three-phase alternating-current electrical power from three-phase terminals; a three-phase bus bar that has a plurality of connecting terminals and a load terminal, the plurality of connecting terminals being connected to the power module, and the load terminal being formed in a crossing direction with respect to the plurality of connecting terminals and being connected to an external load; a bus bar holder configured to hold the three-phase bus bar; and a case that has a through hole through which the three-phase bus bar penetrates, the case being configured to accommodate the power module, the three-phase bus bar, and the bus bar holder; wherein the three-phase terminals are arranged side-by-side on the power module, and the plurality of connecting terminals are respectively formed on the three-phase bus bar so as to correspond to the three-phase terminals, the plurality of connecting terminals being configured to be positioned on the three-phase terminals when the three-phase bus bar and the power module are accommodated in the case.

In the above-described aspect, simply by accommodating the three-phase bus bar and the power module in the case, corresponding connecting terminals of the three-phase bus bar are respectively positioned on the three-phase terminals of the power module, and thereby, in this state, it is possible to assemble the plurality of connecting terminals to the three-phase terminals at once. Therefore, connection between the three-phase buss bar and the power module can be achieved with ease, and it is possible to improve workability upon assembly of the power converter.

DESCRIPTION OF EMBODIMENTS

A power converter 1 according to an embodiment of the present invention will be described below with reference to the drawings.

An overall configuration of the power converter 1 will be described with reference to FIGS. 1 to 7.

Figure 1:
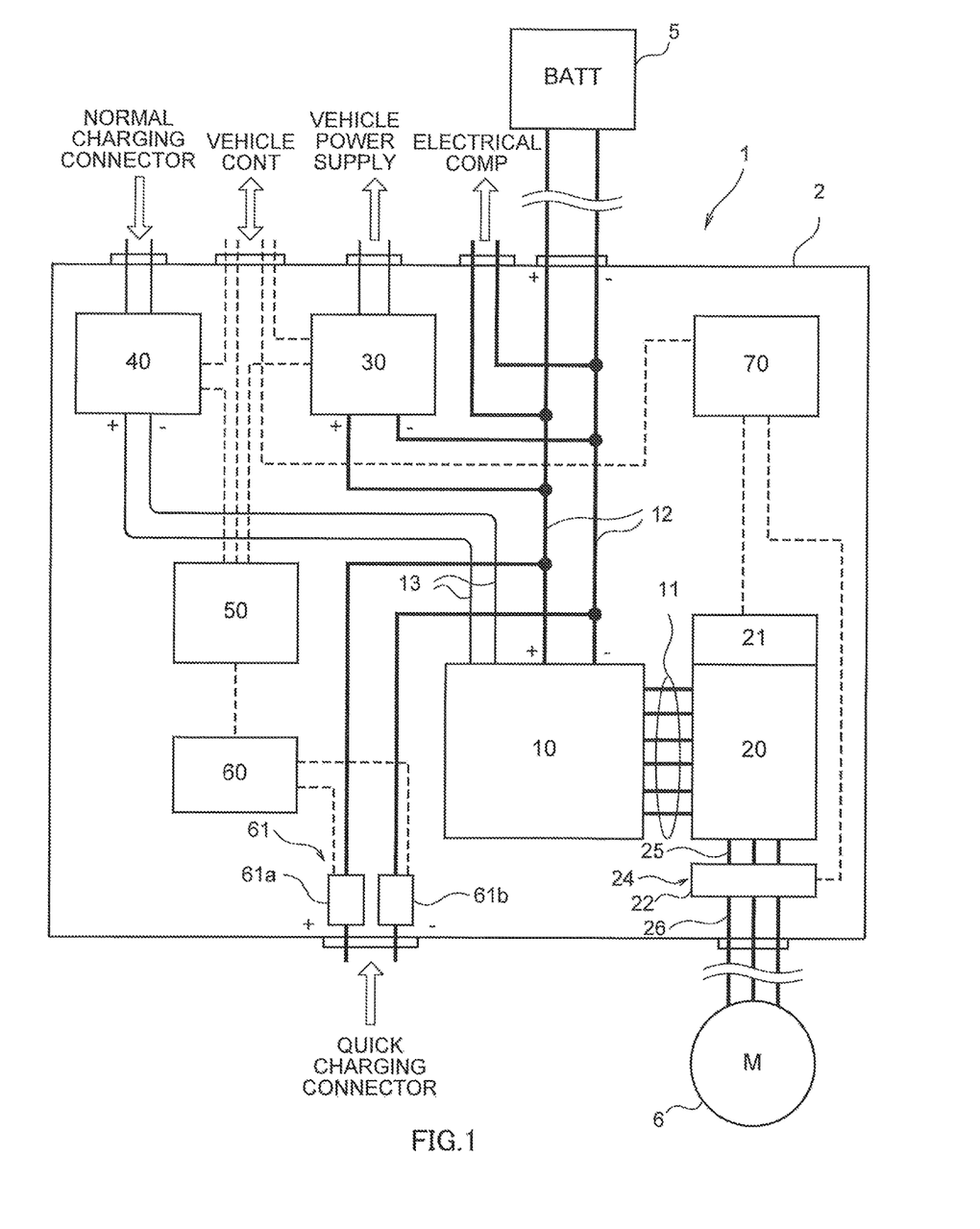
FIG. 1 is a block diagram for explaining a function of a power converter according to an embodiment of the present invention.

FIG. 1 is a block diagram for explaining function of the power converter 1.

As shown in FIG. 1, the power converter 1 is electrically connected to a battery (power storage apparatus) 5 and a motor generator (external load) 6 as a dynamo-electric machine. For example, the power converter 1 is provided in an electric automobile or a plug-in hybrid automobile.

The power converter 1 supplies electrical power for driving to the motor generator 6 by converting direct-current electric power from the battery 5 to alternating-current electrical power suitable for driving of the motor generator 6. In addition, the power converter 1 supplies electrical power for charging to the battery 5 by converting regenerative electrical power (three-phase alternating-current electrical power) from the motor generator 6 to direct-current electric power. Furthermore, the power converter 1 can also supply electrical power for charging to the battery 5 from outside via an external charging connector (not shown) provided in a vehicle.

The battery 5 is formed of, for example, a lithium ion secondary battery. The battery 5 supplies direct-current electric power to the power converter 1, and battery 5 is charged by direct-current electric power supplied by the power converter 1. The voltage of the battery 5 varies over a range of, for example, from 240 to 400 V, and the battery 5 is charged by inputting higher voltage than this voltage.

The motor generator 6 is formed of, for example, a permanent magnet synchronous motor. The motor generator 6 is driven by alternating-current electrical power supplied from the power converter 1. As the motor generator 6 is driven, a driving wheel (not shown) of the vehicle is rotationally driven, and the vehicle is driven. When the vehicle slows down, the motor generator 6 functions as a generator and generates regenerative electrical power.

Figure 2:
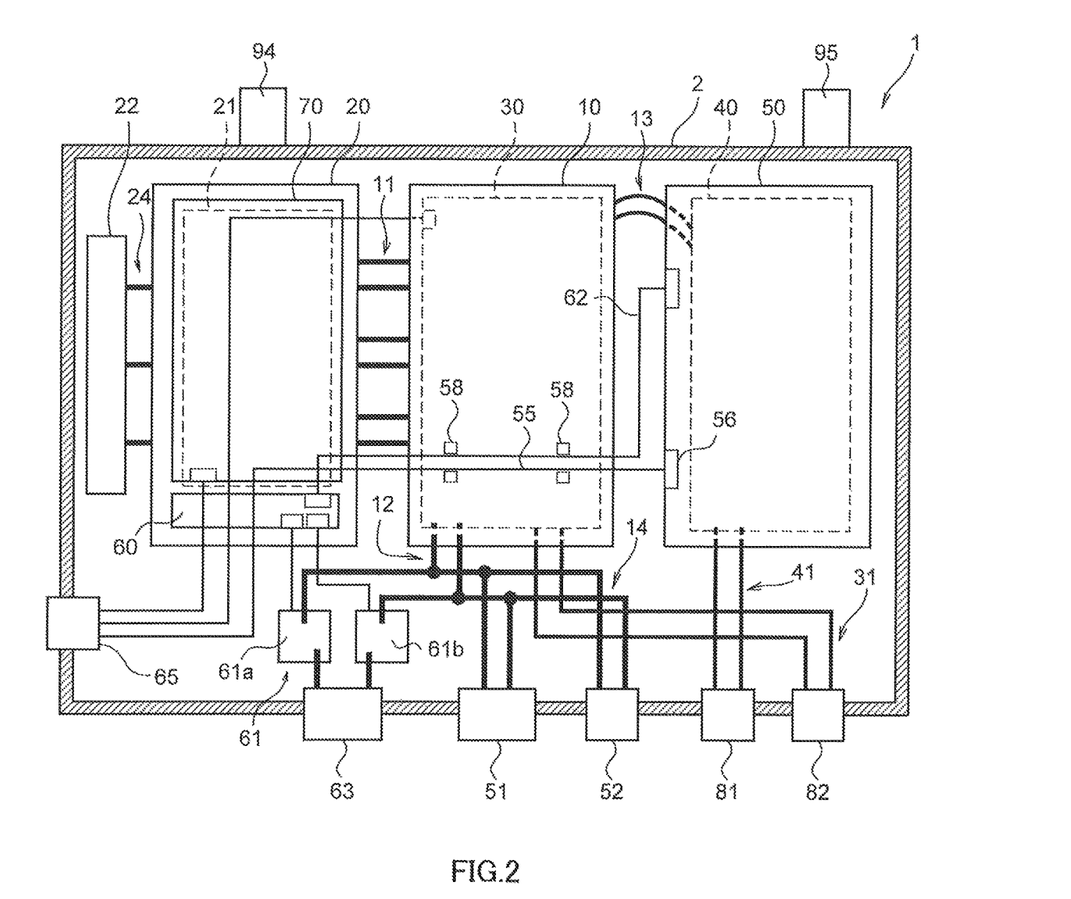
FIG. 2 is a sectional view in a horizontal plane for explaining a configuration of the power converter according to the embodiment of the present invention.
Figure 3:
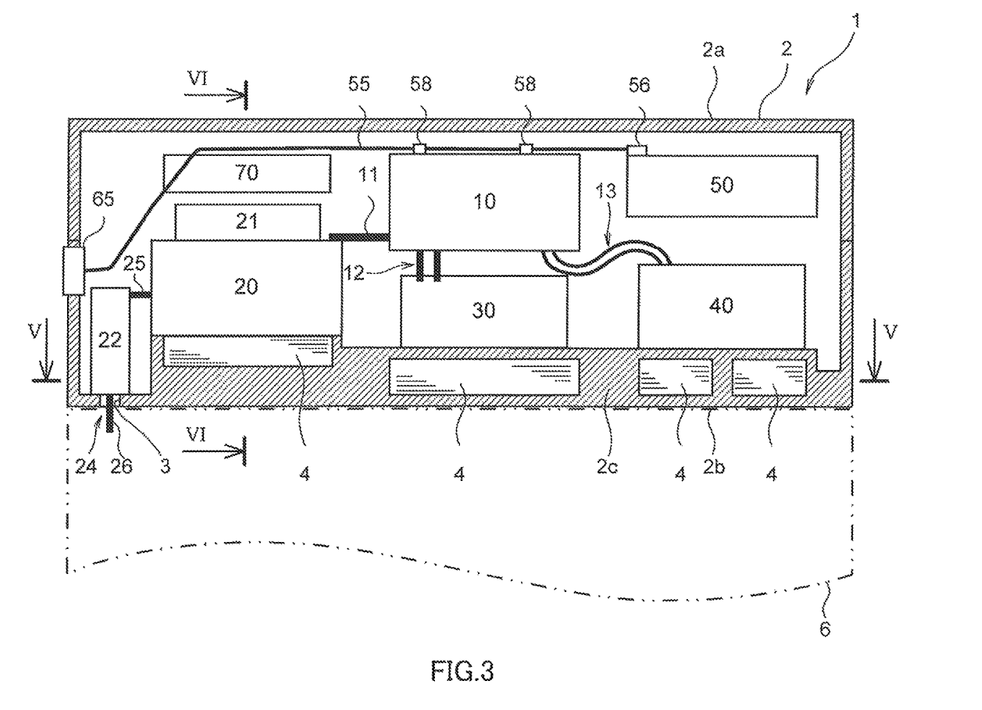
FIG. 3 is a sectional view viewed from the side for explaining a configuration of the power converter according to the embodiment of the present invention.

FIG. 2 is a sectional view in a horizontal plane for explaining the configuration of the power converter 1, and FIG. 3 is a sectional view viewed from the side for explaining the configuration of the power converter 1.

As shown in FIGS. 2 and 3, the power converter 1 includes a capacitor module 10, a power module 20, a DC/DC converter 30, a charger 40, a DC/DC charge controller 50, an inverter controller 70, and a box-shaped case 2 accommodating these components. These components are respectively electrically connected by bus bars or wirings.

As shown in FIG. 3, the case 2 is configured so as to have a box-shape by a bottom case 2b that has a bottom portion 2c and an opening at the upper side and an upper case 2a that closes the opening of the bottom case 2b.

In the bottom case 2b, the power module 20, the DC/DC converter 30, and the charger 40 are provided so as to be in contact with the bottom portion 2c, and the DC/DC converter 30 is provided between the power module 20 and the charger 40. In the bottom case 2b, the capacitor module 10 is arranged so as to straddle over the DC/DC converter 30. A driver substrate 21 is arranged on a top surface of the power module 20, and the inverter controller 70 is arranged above the driver substrate 21. The DC/DC charge controller 50 is arranged above the charger 40. The capacitor module 10 has leg parts (not shown) and is attached into the case 2 by attaching the leg parts to the bottom case 2b.

A coolant-water flow channel 4 (cooling-medium flow channel) is formed within the bottom portion 2c of the bottom case 2b. Coolant water (cooling medium) flows through the coolant-water flow channel 4, and the coolant water cools the power module 20, the DC/DC converter 30, and the charger 40 that are mounted directly above the coolant-water flow channel 4. The coolant-water flow channel 4 will be described with reference to FIGS. 4 to 6.

Figure 4:
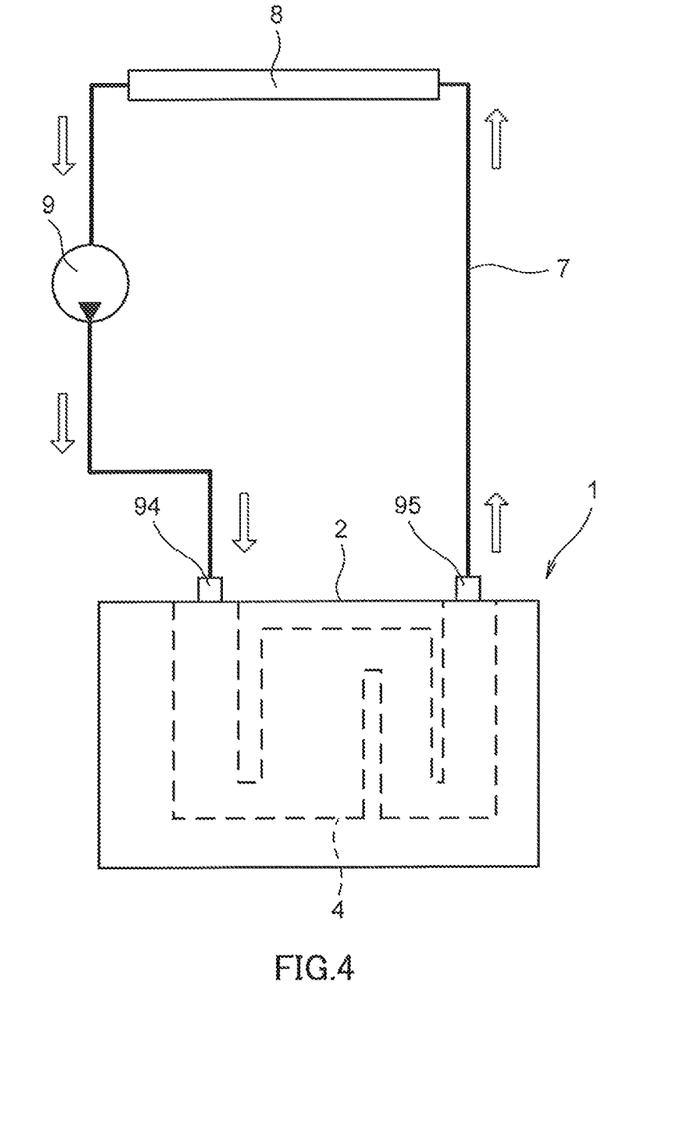
FIG. 4 is a configuration diagram for explaining a circulation flow channel of coolant water.

FIG. 4 is a configuration diagram for explaining a circulation flow channel 7 of the coolant water.

As shown in FIG. 4, the case 2 is provided with a supply flow channel 94 that supplies the coolant water to the coolant-water flow channel 4 from the outside and a discharge flow channel 95 that discharges the coolant water from a charger cooling portion 93 to the outside.

The coolant water that has flown through the coolant-water flow channel 4 is discharged to the circulation flow channel 7 that is connected to the outside through the discharge flow channel 95. The coolant water that has been discharged to the circulation flow channel 7 is cooled by a sub-radiator 8 that is provided in the most front part of the vehicle. The coolant water that has been cooled by the sub-radiator 8 is supplied to the coolant-water flow channel 4 through the supply flow channel 94. A water pump 9 that circulates the coolant water through the circulation flow channel 7 and the coolant-water flow channel 4 is provided between the sub-radiator 8 and the supply flow channel 94 in the circulation flow channel 7.

The supply flow channel 94 and the discharge flow channel 95 are arranged in the case 2 so as to face the forward direction of the vehicle. With such a configuration, the distance between the sub-radiator 8 and the coolant-water flow channel 4 can be made the shortest.

Figure 5:
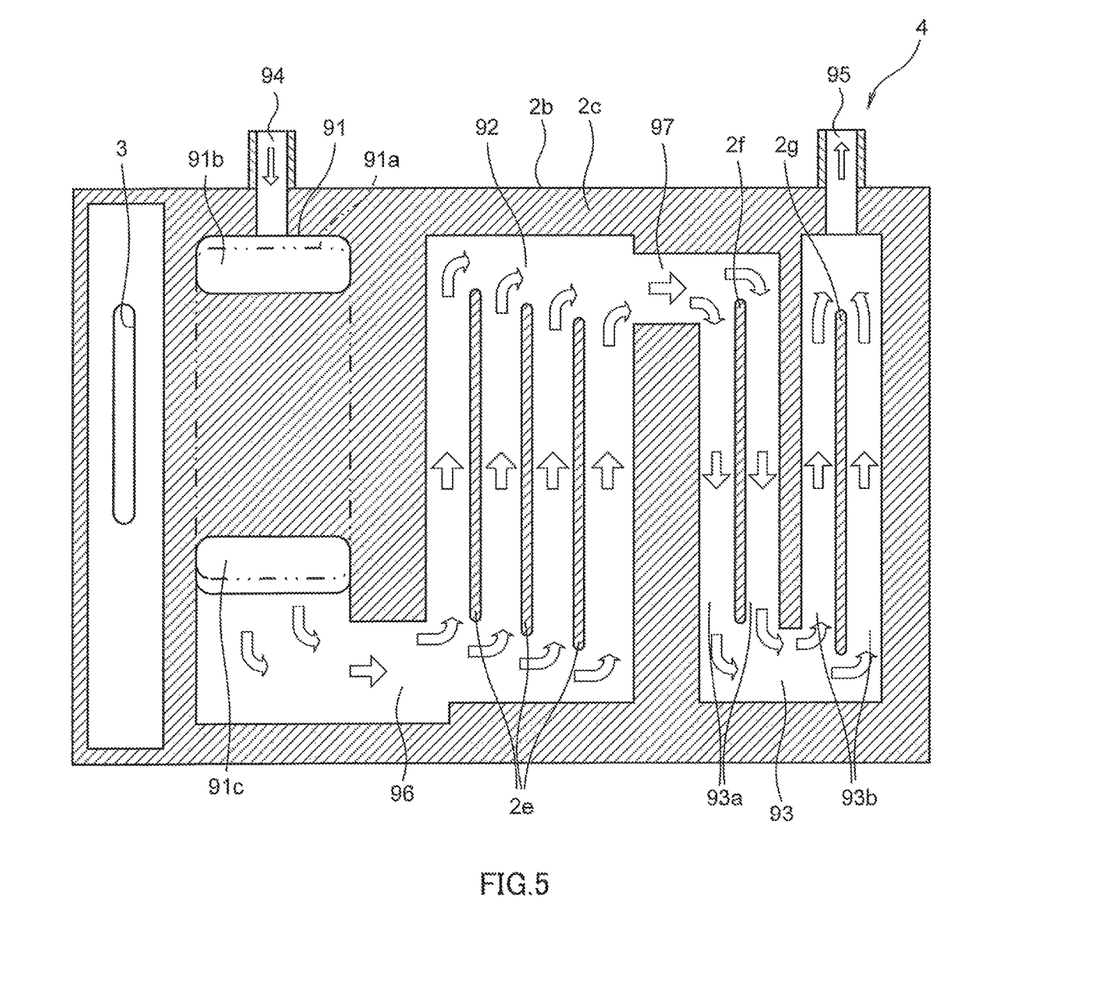
FIG. 5 is a diagram for explaining the coolant-water flow channel, and is a sectional view taken along the line V-V in FIG. 3.

FIG. 5 is a diagram for explaining the coolant-water flow channel 4 and is a sectional view taken along the line V-V in FIG. 3.

As shown in FIG. 5, the coolant-water flow channel 4 has a power-module cooling portion 91 that is formed along the power module 20, a DC/DC-converter cooling portion 92 that is formed along the DC/DC converter 30, and the charger cooling portion 93 that is formed along the charger 40. The power-module cooling portion 91, the DC/DC-converter cooling portion 92, and the charger cooling portion 93 are arranged in series in the coolant-water flow channel 4.

The coolant water flowing through the coolant-water flow channel 4 is supplied from the supply flow channel 94, cools the power module 20, cools the DC/DC converter 30, and cools the charger 40, and thereafter, the coolant water is discharged from the discharge flow channel 95 to the circulation flow channel 7 provided at the outside. The coolant water that has been discharged from the discharge flow channel 95 to the circulation flow channel 7 is cooled by the sub-radiator 8 shown in FIG. 4, and the coolant water is supplied again from the supply flow channel 94 to the coolant-water flow channel 4.

The power module 20 is operated when the vehicle is driven, and in contrast, the charger 40 is operated when the vehicle is stopped. Therefore, when the charger 40 needs to be cooled, it is possible to prevent the coolant water from becoming high temperature by the cooling of the power module 20. Therefore, even when the power-module cooling portion 91 and the charger cooling portion 93 are arranged in series in the coolant-water flow channel 4, it is possible to cool both of the power module 20 and the charger 40 sufficiently with the coolant water. In addition, because the power-module cooling portion 91 and the charger cooling portion 93 are arranged in series in the coolant-water flow channel 4, it is not necessarily to respectively provide a plurality of flow channels for the coolant water, and the power converter 1 can be cooled by the coolant-water flow channel 4 having a simple configuration.

Although the DC/DC converter 30 is operated at the same time as the power module 20 and the charger 40, the amount of heat generated by the DC/DC converter 30 is relatively small compared to that generated by the power module 20 and the charger 40. Therefore, even when the DC/DC-converter cooling portion 92 is arranged in series in the coolant-water flow channel 4, there is no influence on the cooling efficiency of the power converter 1.

Figure 6:
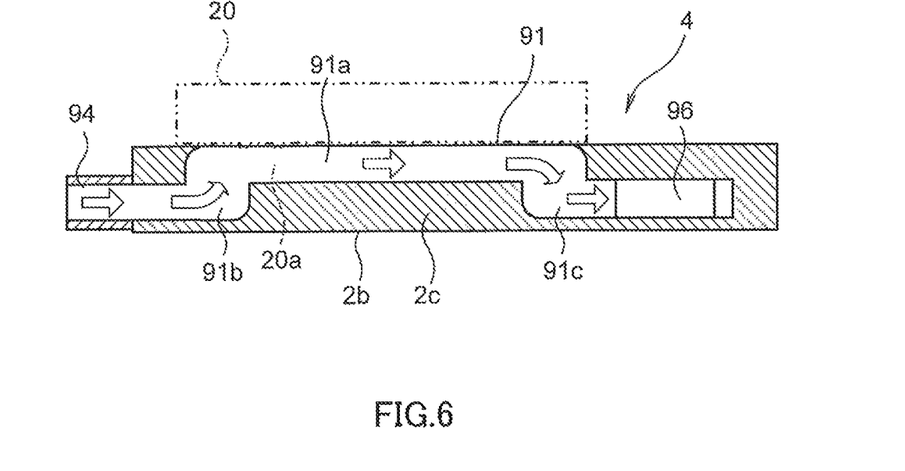
FIG. 6 is a diagram for explaining the coolant-water flow channel, and a sectional view taken along the line VI-VI in FIG. 3.

FIG. 6 is a diagram for explaining the coolant-water flow channel 4 and is a sectional view taken along the line VI-VI in FIG. 3.

As shown in FIG. 6, the power-module cooling portion 91 has an upper cooling portion 91a that is formed to have an opening at the surface facing the power module 20 and that directly cools the power module 20 by the coolant water flowing therethrough, an up-flow connecting portion 91b that guides the coolant water that has been supplied from the supply flow channel 94 to the upper cooling portion 91a provided at a higher level than the up-flow connecting portion 91b, and a down-flow connecting portion 91c that guides the coolant water that has flown through the upper cooling portion 91a to the DC/DC-converter cooling portion 92 provided at a lower level than the upper cooling portion 91a.

As shown in FIGS. 5 and 6, a flow-channel area of the supply flow channel 94 is smaller relative to a flow-channel area of the power-module cooling portion 91. However, the coolant water that has been supplied from the supply flow channel 94 spreads fully in the width direction of the power-module cooling portion 91 (the left-right direction in FIG. 5) as it hits a wall portion of the up-flow connecting portion 91b and flows upwards. Thus, by providing the up-flow connecting portion 91b, a non-uniform flow of the coolant water to a part of the upper cooling portion 91a can be prevented, and thereby, it is possible to cool the entire power module 20 uniformly.

As shown in FIG. 6, a plurality of heat sinks 20a are provided on a lower surface of the power module 20 so as to project out. The coolant water flowing through the upper cooling portion 91a is brought into contact with the lower surface of the power module 20 and the heat sinks 20a and cools the power module 20 directly. In addition, the coolant water that has been guided from the supply flow channel 94 is supplied first to the power-module cooling portion 91. Thus, the coolant water flows through the power-module cooling portion 91 in a state having the lowest temperature in the coolant-water flow channel 4. With such a configuration, it is possible to efficiently cool the power module 20 that generates the greatest amount of heat in the power converter 1.

As shown in FIG. 5, the DC/DC-converter cooling portion 92 is turned in the opposite direction from the power-module cooling portion 91 via a first connecting portion 96. With such a configuration, the flow direction of the coolant water in the power-module cooling portion 91 and the flow direction of the coolant water in the DC/DC-converter cooling portion 92 are opposed to each other.

The DC/DC-converter cooling portion 92 is divided into four flow channels by three ribs 2e formed along the flow direction of the coolant water. With such a configuration, because the non-uniform flow of the coolant water in the DC/DC-converter cooling portion 92 is prevented, it is possible to cool the entire DC/DC converter 30 uniformly.

The charger cooling portion 93 has first cooling portions 93a that are turned in the opposite direction from the DC/DC-converter cooling portion 92 via a second connecting portion 97 and second cooling portions 93b that are further turned in the opposite direction from the first cooling portions 93a to the discharge flow channel 95. With such a configuration, the flow direction of the coolant water in the DC/DC-converter cooling portion 92 and the flow direction of the coolant water in the first cooling portions 93a are opposed to each other. In addition, the flow direction of the coolant water in the first cooling portions 93a and the flow direction of the coolant water in the second cooling portions 93b are opposed to each other.

The first cooling portions 93a and the second cooling portions 93b are respectively formed along the arrangement of electronic components (not shown) that generate great amount of heat installed on the charger 40. The first cooling portions 93a are divided into two flow channels by a rib 2f formed along the flow direction of the coolant water. Similarly, the second cooling portions 93b are also divided into two flow channels by a rib 2g formed along the flow direction of the coolant water. With such a configuration, because the non-uniform flow of the coolant water in the charger cooling portion 93 is prevented, it is possible to cool the entire charger 40 uniformly.

In addition, because the second cooling portions 93b are turned in the opposite direction from the first cooling portions 93a, it is possible to form the supply flow channel 94 and the discharge flow channel 95 on the same side surface of the case 2. Therefore, because the respective distances from the supply flow channel 94 and the discharge flow channel 95 to the sub-radiator 8 can be made shorter, it is possible to supply/discharge the coolant water through short circulation flow channel 7.

The description of the configuration of the power converter 1 will be continued with reference back to FIGS. 2 and 3.

As shown in FIG. 3, an external surface of the bottom portion 2c of the bottom case 2b faces the motor generator 6. The bottom portion 2c of the bottom case 2b has a through hole 3 through which an output bus bar (three-phase bus bar) 24, which will be described later, is inserted. The through hole 3 is formed at a region of the bottom case 2b other than the region in which the coolant-water flow channel 4 is formed. Thus, compared with a case in which the through hole 3 is formed in the region in which the coolant-water flow channel 4 is formed, there is no need to provide a sealing etc. for the through hole 3, and therefore, it is possible to reduce the size of the bottom case 2b and to ensure sealing performance for the coolant water.

The capacitor module 10 is formed of a plurality of capacitor elements (capacitors) and includes first bus bars 11, second bus bars 12, and electrical power wires 13. The first bus bars 11, the second bus bars 12, and the electrical power wires 13 share the positive electrode and the negative electrode in the capacitor module 10. The capacitor module 10 smoothes, for example, voltage of direct-current electric power supplied from the battery 5 and voltage of regenerative electrical power regenerated by the motor generator 6 via the power module 20. As described above, the capacitor module 10 performs removal of noise and suppression of voltage fluctuation by smoothing the voltage.

The power module 20 has the driver substrate 21 and a plurality of power elements (not shown). The driver substrate 21 performs ON/OFF control of the power elements of the power module 20 on the basis of a signal from the inverter controller 70, which will be described later. In addition, the power module 20 is connected to a current sensor 22 and output bus bar 24. The current sensor 22 is a sensor that is provided to the output bus bar 24 and that detects electric current through the output bus bar 24. The output bus bar 24 is directly connected, as a three-phase bus bar formed of a U-phase, a V-phase, and a W-phase, to three-phase terminals formed of the U-phase, the V-phase, and the W-phase of the power module 20, respectively, and the output bus bar 24 outputs three-phase alternating-current electrical power to the motor generator 6. In the power module 20, the ON/OFF control of the power elements is performed by the driver substrate 21, and thereby, direct-current electric power from the battery 5 and alternating-current electrical power from the motor generator 6 are respectively converted.

The DC/DC converter 30 is connected to a vehicle-side connector 82 via a bus bar 31. The vehicle-side connector 82 is connected to harnesses, etc. for supplying direct-current power supply output from the DC/DC converter 30 to respective parts of the vehicle. The DC/DC converter 30 converts voltage of direct-current electric power supplied from the battery 5 and supplies it to other devices. The DC/DC converter 30 steps down voltage of direct-current electric power from the battery 5 (for example, 400 V) to 12 V direct-current electric power. Direct-current electric power voltage of which has been stepped down is supplied as a power supply to a controller, lighting, fan, and so forth mounted on the vehicle. The DC/DC converter 30 is connected to the capacitor module 10 and the battery 5 via the second bus bars 12.

The charger 40 converts alternating-current electrical power (for example, AC 200 V) of commercial power supply, which is supplied from the outside of the vehicle via a normal charging connector 81, to direct-current electric power (for example, DC 500 V). Direct-current electric power converted by the charger 40 is supplied from the electrical power wires 13 to the battery 5 via the capacitor module 10. With such a configuration, the battery 5 is charged.

With the power converter 1 configured as described above, the power module 20, the DC/DC converter 30, and the charger 40 are arranged so as to be adjacent to the capacitor module 10 and are connected by the first bus bars 11, the second bus bars 12, and the electrical power wires 13, respectively. Thus, the distances between the capacitor module 10 and each of the power module 20, the DC/DC converter 30, and the charger 40 can be made shorter. Therefore, it is possible to reduce resistance (R[Ω]) and inductance (L[H]) on the path of direct-current electric power and to reduce electrical power loss.

In addition, the capacitor module 10 is arranged between the power module 20 and the charger 40 that generate large amount of heat. Thus, it is possible to suppress mutual influence by the heat between the power module 20 and the charger 40. Especially, because operation of the power module 20 (power running and regeneration of the motor generator 6) and operation of the charger 40 (charging of the battery 5 by an external connector connected via the normal charging connector 81) are not performed at the same time, it is possible to eliminate influence by the heat between the operations.

The DC/DC charge controller 50 controls driving of the motor generator 6 and charging of the battery 5 by the power converter 1 on the basis of an instruction from a controller (not shown) of the vehicle. For the charging of the battery 5, either of charging by the normal charging connector 81 via the charger 40 or charging by a quick charging connector 63 without using the charger 40 is selected by the DC/DC charge controller 50.

As shown in FIG. 1, the inverter controller 70 outputs to the driver substrate 21 a signal for operating the power module 20 on the basis of an instruction from the controller of (not shown) of the vehicle and on the basis of electric current value of the output bus bar 24 of the power module 20 detected by the current sensor 22, which will be described later.

An inverter module that mutually converts direct-current electric power and alternating-current electric power is formed of the inverter controller 70, the power module 20, and the capacitor module 10.

As shown in FIG. 2, a relay controller 60 is arranged on the side of the inverter controller 70. The relay controller 60 is controlled by the DC/DC charge controller 50 and controls opening/closing of contacts of relays 61. The relays 61 are formed of a positive-side relay 61a and a negative-side relay 61b. In the relays 61, the contacts are opened and connection is established when an external charging connector (not shown) is connected to the quick charging connector 63, and thereby, direct-current electric power (for example, 500 V) supplied from the quick charging connector 63 is supplied to the second bus bars 12. The battery 5 is charged by the supplied direct-current electric power.

As shown in FIGS. 2 and 3, the first bus bars 11 of the capacitor module 10 project out towards the side from one side surface of the capacitor module 10 and are directly connected to the power module 20 by using screws, etc. The first bus bars 11 are formed of three pairs of bus bars each pair of which is composed of the positive electrode and the negative electrode.

As shown in FIG. 3, the second bus bars 12 of the capacitor module 10 project out downwards from a bottom surface of the capacitor module 10 and are directly connected to the DC/DC converter 30 by using screws, etc. In addition, as shown in FIG. 2, the second bus bars 12 are formed of a pair of bus bars composed of the positive electrode and the negative electrode as a pair, and the positive-side relay 61a and the negative-side relay 61b of the relays 61 are connected to the positive electrode and the negative electrode, respectively. Furthermore, the second bus bars 12 are respectively connected via bus bars 14 to a battery-side connector 51 connected to the battery 5 and a compressor-side connector 52 connected to an electric compressor.

As shown in FIGS. 2 and 3, the electrical power wires 13 of the capacitor module 10 are flexible cables having bendability that extend from other side surface of the capacitor module 10 opposite from the side surface thereof where the first bus bars 11 project out, and the electrical power wires 13 are connected to the charger 40. The charger 40 is connected to the normal charging connector 81 via bus bars 41.

As shown in FIGS. 2 and 3, the DC/DC charge controller 50 and a signal line connector 65 are connected by signal lines 55. The signal line connector 65 allows connection between the outside of the case 2 and the signal lines 55 that are connected to the DC/DC converter 30, the charger 40, the DC/DC charge controller 50, and the inverter controller 70.

In addition, the DC/DC charge controller 50 and the relay controller 60 are connected by a signal line 62 that is packed together with the signal lines 55.

The signal lines 55 and the signal line 62 are connected to a connector 56 of the DC/DC charge controller 50 by extending through a top surface of the capacitor module 10. A plurality of guide parts 58 for supporting the signal lines 55 and the signal line 62 are formed on the top surface of the capacitor module 10.

As shown in FIG. 3, the output bus bar 24 of the power module 20 has power module terminals (connecting terminals) 25 and motor terminals (load terminals) 26.

Figure 7:
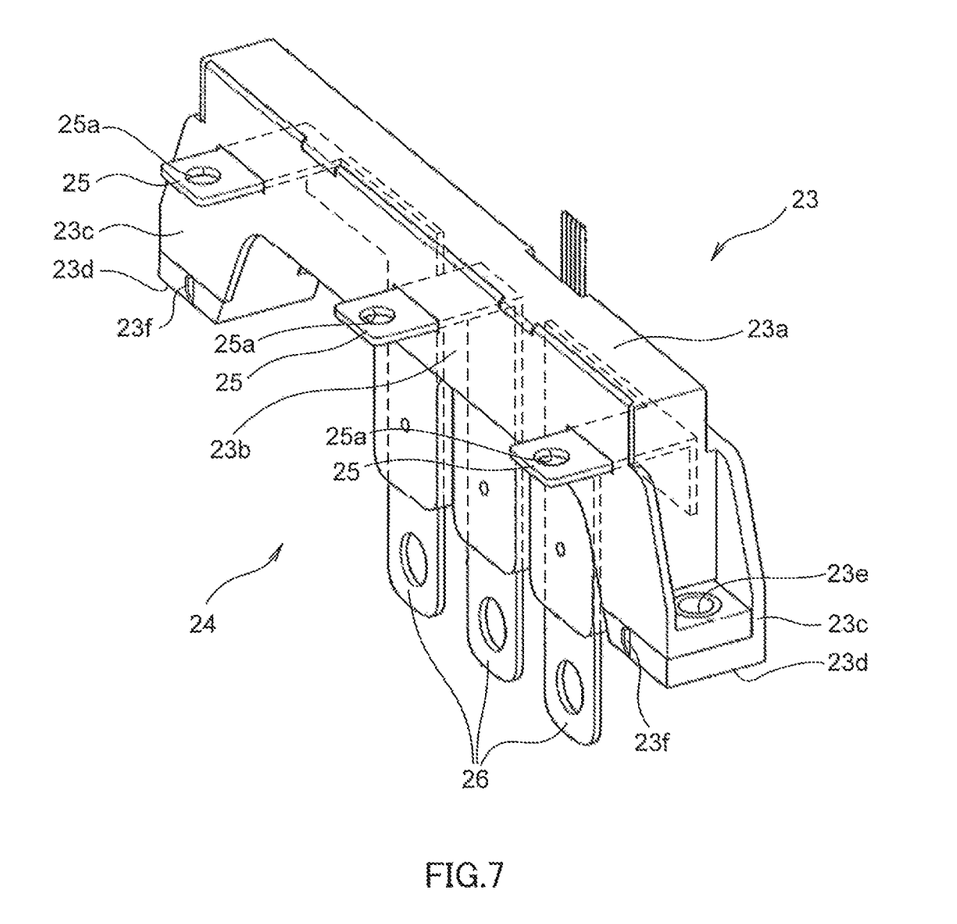
FIG. 7 is a perspective view of an output bus bar in the power converter.

A plurality of the power module terminals 25 of the output bus bar 24 are connected to the surface of the power module 20 opposite from the side surface facing to the DC/DC converter 30. The power module 20 is positioned at the side of the output bus bar 24. As shown in FIG. 7, cofastening holes 25a are formed in the power module terminals 25.

As shown in FIG. 3, the motor terminals 26 of the output bus bar 24 are connected to the motor generator 6 positioned below the output bus bar 24. The motor terminals 26 are formed so as to extend in the crossing direction with respect to the power module terminals 25 at the right angle. Tip ends of the motor terminals 26 are inserted into the through hole 3 of the bottom portion 2c of the case 2 and exposed to the outside. With such a configuration, the motor terminals 26 can be connected via harnesses, etc. (not shown) to the motor generator 6.

As described above, because the case 2 accommodating the power module 20 and the output bus bar 24 has the through hole 3 through which the output bus bar 24 is inserted, simply by assembling the power module 20 and the output bus bar 24 to the case 2 from which the upper case 2a is detached, the output bus bar 24 is inserted into the through hole 3 and is projected out from the case 2.

Therefore, because there is no need to turn over the case 2, it is possible to improve workability upon assembly of the power converter 1.

Figure 8:
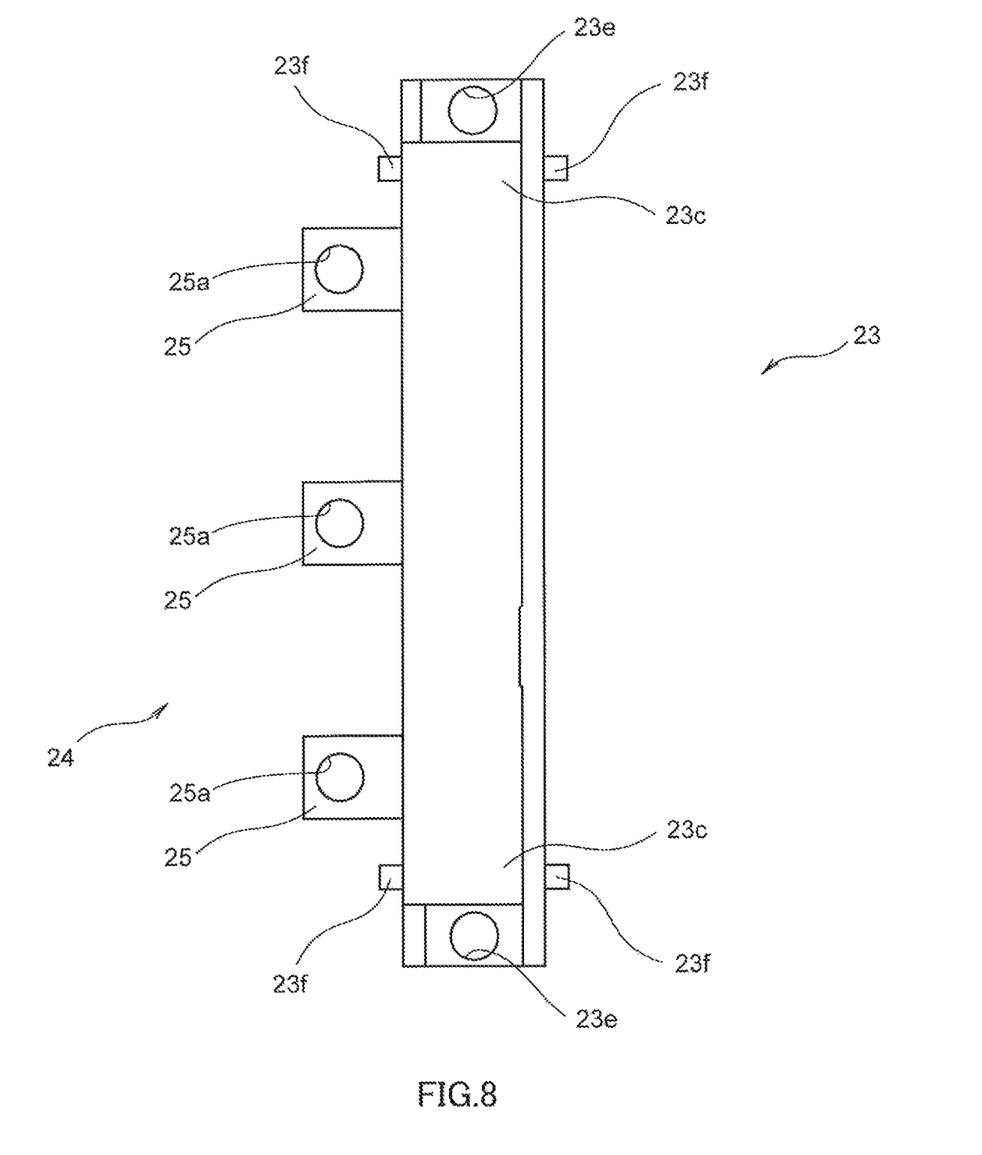
FIG. 8 is a plan view of the output bus bar in the power converter.

FIG. 7 is a perspective view of the output bus bar 24 of the power converter 1, and FIG. 8 is a plan view of the output bus bar 24 of the power converter 1.

As shown in FIG. 7, the output bus bar 24 is held by a bus bar holder 23. The bus bar holder 23 is formed of a bus-bar holding portion 23a that holds the output bus bar 24 and a sensor portion 23b that is engaged within the bus-bar holding portion 23a in a state being attached in the sensor portion 23b. As shown by a broken line in FIG. 7, the power module terminals 25 and the motor terminals 26 of the output bus bar 24 are electrically connected in the bus bar holder 23.

The bus-bar holding portion 23a has leg parts 23c as a pair of attachment parts for attachment to the case 2. The leg parts 23c have bottom surfaces 23d that are brought into contact with the case 2, fastening holes 23e for fastening the output bus bar 24 to the case 2, and two pairs of guides 23f that are formed so as to respectively project out on both sides of the leg parts 23c, as shown in FIG. 8. The guides 23f are formed to have a rib shape extending in the direction in which the output bus bar 24 penetrates through.

Figure 9A:
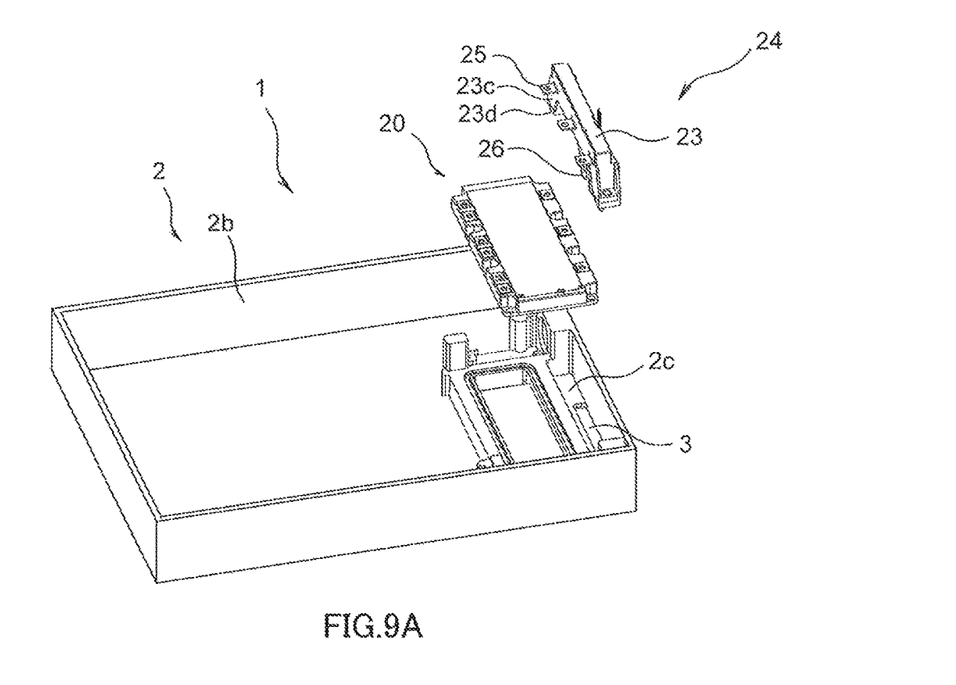
FIG. 9A is a perspective view of the power converter before arranging a bus bar holder for holding the output bus bar in a case.
Figure 9B:
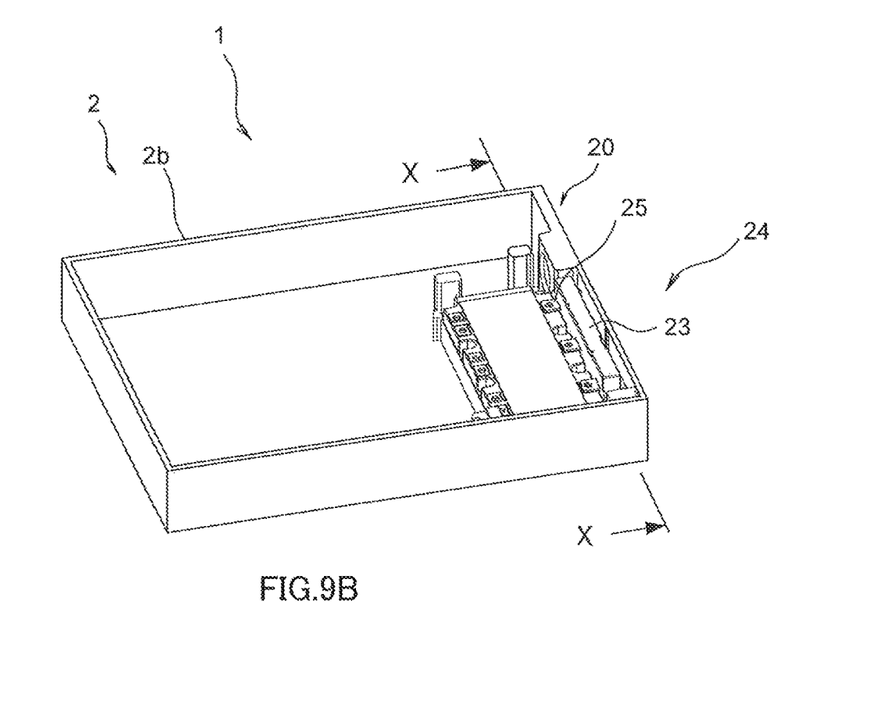
FIG. 9B is a perspective view of the power converter after arranging the bus bar holder for holding the output bus bar in the case.
Figure 10:
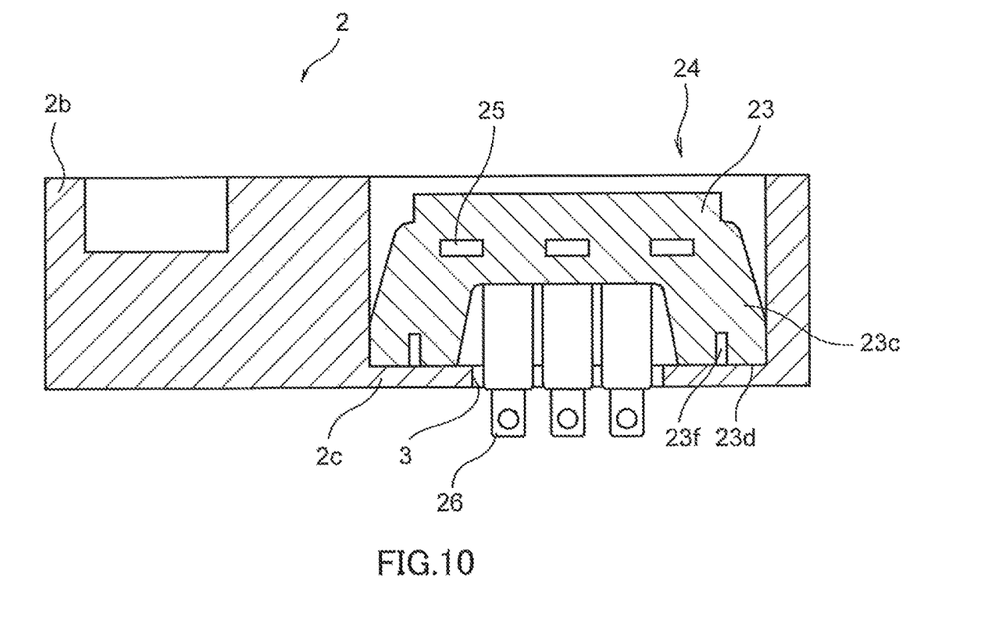
FIG. 10 is a sectional view of the case and the bus bar holder taken along the line X-X in FIG. 9B.

FIG. 9A is a perspective view of the power converter 1 before the bus bar holder 23 holding the output bus bar 24 is arranged in the case 2, and FIG. 9B is a perspective view of the power converter 1 after the bus bar holder 23 holding the output bus bar 24 is arranged in the case 2. In addition, FIG. 10 is a sectional view of the case 2 and the bus bar holder 23 taken along the line X-X in FIG. 9B. In FIGS. 9A and 9B, the configurations of the power converter 1 other than the case 2, the bus bar holder 23 holding the output bus bar 24, and the power module 20 are omitted.

As shown in FIGS. 9A and 9B, after the power module 20 is arranged so as to be brought into contact with the bottom portion 2c of the case 2, the bus bar holder 23 is inserted from the above into a gap between the power module 20 and a side portion of the case 2. As shown in FIG. 10, the bus bar holder 23 is inserted until the bottom surfaces 23d of the leg parts 23c are brought into contact with the bottom portion 2c of the case 2. As described above, the bottom portion 2c of the case 2 is provided with the power module 20, the output bus bar 24, and the bus bar holder 23.

When the bus bar holder 23 is inserted into the case 2, the position of the bus bar holder 23 is defined by being guided by the two pairs of guides 23f formed on the leg parts 23c. Specifically, the position of the bus bar holder 23 with respect to the case 2 is defined by the one of the pair of guides 23f that project towards the case 2, and the position of the bus bar holder 23 with respect to the power module 20 is defined by the other of the guides 23f that project towards the power module 20. Because the guides 23f are formed to have a rib shape extending in the direction in which the output bus bar 24 penetrate through, it is possible to insert the bus bar holder 23 into the case 2 without causing the guides 23f to be caught by the side portion, etc. of the case 2. Therefore, with the guides 23f, it is possible to stably arrange the bus bar holder 23 to a constant position in the case 2.

When the insertion of the bus bar holder 23 is completed, the power module terminals 25 of the output bus bar 24 are brought into contact with and overlap with top portions of the three-phase terminals of the power module 20. Subsequently, the power module terminals 25 are fastened to the three-phase terminals by screws (not shown) that are inserted into the cofastening holes 25a of the power module terminals 25. Therefore, it is possible to perform connection of the output bus bar 24 and the power module 20 with ease.

After the bus bar holder 23 is inserted, the bus bar holder 23 is fastened to the case 2 by screws (not shown) that are inserted into the fastening holes 23e.

As described above, because the case 2 accommodating the power module 20 and the output bus bar 24 has the through hole 3 through which the output bus bar 24 is inserted, simply by assembling the power module 20 and the output bus bar 24 into the case 2, from which the upper case 2a is detached, the output bus bar 24 is inserted through the through hole 3 and projects out from the case 2.

According to the embodiment mentioned above, the advantages described below are afforded.

Simply by accommodating the output bus bar 24 and the power module 20 in the case 2, the corresponding power module terminals 25 of the output bus bar 24 are respectively positioned on the three-phase terminals of the power module 20, and thereby, in this state, it is possible to assemble the plurality of power module terminals 25 to the three-phase terminals at once. Therefore, it is possible to connect the output bus bar 24 and the power module 20 with ease and to improve the workability upon assembly of the power converter 1.

In addition, the bus bar holder 23 has the leg parts 23c that are attached to the bottom portion 2c of the case 2 to fix the plurality of power module terminals 25 and the motor terminals 26 to the case 2. When the leg parts 23c are attached to the bottom portion 2c of the case 2, the plurality of power module terminals 25 are positioned on the three-phase terminals of the power module 20. With such a configuration, simply by attaching the output bus bar 24 to the case 2 and by connecting the power module terminals 25 and the three-phase terminals that are overlapped to each other, the connection of the output bus bar 24 and the power module 20 is completed. Therefore, it is possible to improve assemblability of the output bus bar 24 and the power module 20.

Although the embodiment of the present invention has been described above, the above-mentioned embodiment is only an illustration of one of application examples of the present invention, and there is no intention to limit the technical scope of the present invention to the specific configuration of the above-mentioned embodiment.

For example, in the above-mentioned embodiment, the bus bar holder 23 is inserted until the bottom surfaces 23d of the leg parts 23c are brought into contact with the bottom portion 2c of the case 2; however, the bus bar holder 23 may be inserted until a part of the bus bar holder 23 (i.e. not limited to the leg parts 23c) is brought into contact with a part of the case 2.

Figure 11:
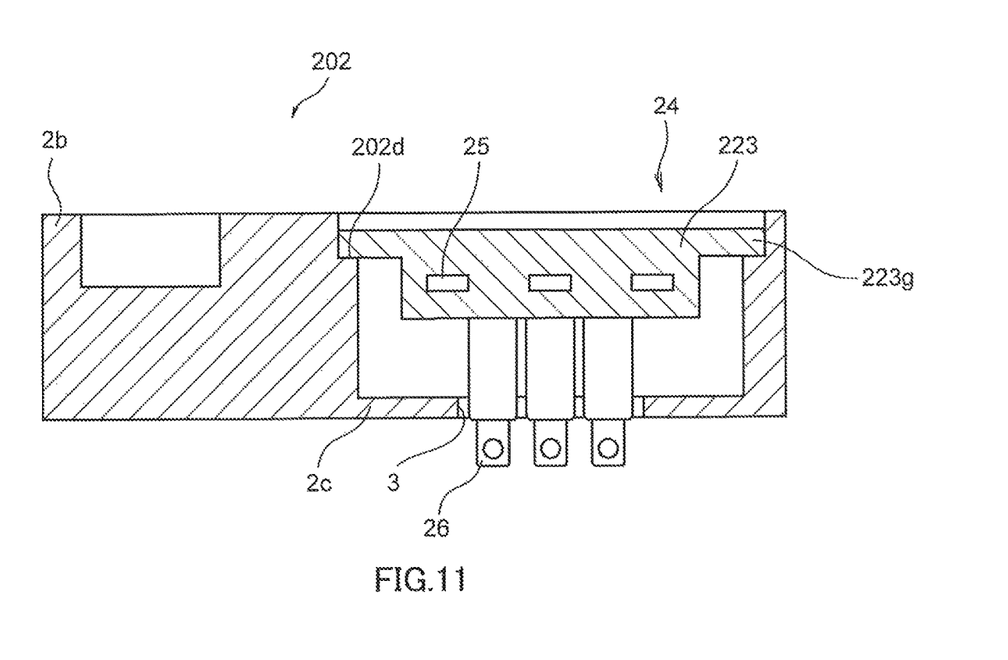
FIG. 11 is a sectional view of the case and the bus bar holder according to an modification of the embodiment of the present invention.

FIG. 11 is a sectional view of a case 202 and a bus bar holder 223 according to a modification of the embodiment of the present invention.

As shown in FIG. 11, the bus bar holder 223 includes a wide arm portion 223g as an attachment part, and the case 202 includes a step portion 202d into which the arm portion 223g can be inserted. The bus bar holder 223 is inserted until the arm portion 223g is brought into contact with a top surface of the step portion 202d of the case 202, and subsequently, the bus bar holder 223 is fixed to the case 202 by attaching the arm portion 223g to the step portion 202d. When the insertion of the bus bar holder 223 is completed, the power module terminals 25 of the output bus bar 24 are brought into contact with and overlap with top portions of the three-phase terminals of the power module 20.

Also with the aspect described above, because an attachment position of the bus bar holder 223 can be adjusted with respect to the case 202 by using the arm portion 223g instead of the leg parts 23c, it is possible to achieve the advantages similar to those described in the above-mentioned embodiment.

In addition, grooves corresponding to the guides 23f of the bus bar holder 23 may be provided on the side portion of the case 2 and/or the side portion of the power module 20. Also with the aspect described above, it is possible to place the bus bar holder 23 to the constant position in the case 2.

The above-mentioned embodiments may be combined appropriately.

This application claims priority based on Japanese Patent Application No. 2015-101089 filed with the Japan Patent Office on May 18, 2015, and Japanese Patent Application No. 2016-089224 filed with the Japan Patent Office on Apr. 27, 2016, the entire contents of which are incorporated into this specification.

The invention claimed is:

1. A power converter comprising:
a power module configured to convert direct-current electric power to three-phase alternating-current electrical power, the power module being configured to output the three-phase alternating-current electrical power from three-phase terminals;
a three-phase bus bar that has a plurality of connecting terminals and a load terminal, the plurality of connecting terminals being connected to the power module, and the load terminal being formed in a crossing direction with respect to the plurality of connecting terminals and configured to connect to an external load;
a bus bar holder configured to hold the three-phase bus bar; and
a case that has a through hole through which the three-phase bus bar penetrates, the case being configured to accommodate the power module, the three-phase bus bar, and the bus bar holder, which are inserted in a direction in which the three-phase bus bar penetrates through the through hole, wherein
the three-phase terminals are arranged side-by-side on the power module,
the plurality of connecting terminals are respectively formed on the three-phase bus bar so as to correspond to the three-phase terminals, the plurality of connecting terminals being configured to be positioned on the three-phase terminals when the three-phase bus bar and the power module, which are accommodated in the case, are inserted in the direction in which the three-phase bus bar penetrates through the through hole,
the bus bar holder further includes an attachment part, the attachment part being attached to a part of the case to fix the plurality of connecting terminals and the load terminal to the case, and
the plurality of connecting terminals overlap with the three-phase terminals from the direction in which the three-phase bus bar penetrates through the through hole when the attachment part is attached to the part of the case.

2. The power converter according to claim 1, wherein the attachment part has a guide to define a position of the bus bar holder with respect to the case.

3. The power converter according to claim 2, wherein the guide is a rib that extends in the direction in which the three-phase bus bar penetrates through the through hole.

4. The power converter according to claim 1, wherein the load terminal is configured such that the three-phase bus bar is inserted into the through hole and exposed to an outside of the case.

5. The power converter according to claim 4, wherein the case has a cooling-medium flow channel structured to permit cooling medium to flow through the cooling-medium flow channel, the cooling-medium flow channel being configured to cool the power module, and the through hole is formed at a region of the case other than a region in which the cooling-medium flow channel is provided.

6. The power converter according to claim 5, wherein the case is formed to have a box-shape having a bottom portion in which the power module, the three-phase bus bar, and the bus bar holder are provided, and the cooling-medium flow channel is formed in the bottom portion.

7. The power converter according to claim 5, further comprising:
a DC/DC converter provided to face the three-phase bus bar so as to sandwich the power module therebetween, the DC/DC converter being configured to convert direct-current voltage supplied from a power storage apparatus; and
a charger provided to face the power module so as to sandwich the DC/DC converter therebetween, the charger being configured to convert three-phase alternating-current electrical power, which is supplied via an external connector, to direct-current electric power, and the charger being configured to charge the power storage apparatus.

8. The power converter according to claim 7, wherein the cooling medium flowing through the cooling-medium flow channel is discharged to the outside after cooling the power module, the DC/DC converter, and the charger.

9. The power converter according to claim 7, further comprising:
a capacitor module attached to the case so as to straddle over the DC/DC converter, the capacitor module being configured to have a capacitor that smooths voltage supplied from the power storage apparatus.

10. The power converter according to claim 4, wherein the external surface of the case through which the through hole is formed faces the external load.

11. The power converter according to claim 1, wherein:
an external surface of the case through which the through hole is formed faces the external load;
the connecting terminals and three-phase terminals are fastened;
the attachment part is fastened to the case; and
a fastening direction of the connecting terminals and a fastening direction of the attachment part are the same as the direction in which the three-phase bus bar penetrates through the through hole.

12. A power converter comprising:
a power module configured to convert direct-current electric power to three-phase alternating-current electrical power, the power module being configured to output the three-phase alternating-current electrical power from three-phase terminals;
a three-phase bus bar that has a plurality of connecting terminals and a load terminal, the plurality of connecting terminals being connected to the power module, and the load terminal being formed in a crossing direction with respect to the plurality of connecting terminals and configured to connect to an external load;
a bus bar holder configured to hold the three-phase bus bar; and
a case that has a through hole through which the three-phase bus bar penetrates, the case being configured to accommodate the power module, the three-phase bus bar, and the bus bar holder, wherein
the three-phase terminals are arranged side-by-side on the power module,
the plurality of connecting terminals are respectively formed on the three-phase bus bar so as to correspond to the three-phase terminals, the plurality of connecting terminals being configured to be positioned on the three-phase terminals when the three-phase bus bar and the power module are accommodated in the case,
the load terminal is configured such that the three-phase bus bar is inserted into the through hole and exposed to an outside of the case,
the case is formed to have a box-shape having a bottom portion in which the power module, the three-phase bus bar, and the bus bar holder are provided,
the case has a cooling-medium flow channel structured to permit cooling medium to flow through the cooling-medium flow channel, the cooling-medium flow channel being configured to cool the power module,
the through hole is formed at a region of the case other than a region in which the cooling-medium flow channel is provided, and
the cooling-medium flow channel is formed in the bottom portion.

13. The power converter according to claim 12, wherein the bus bar holder further includes an attachment part, the attachment part being attached to a part of the case to fix the plurality of connecting terminals and the load terminal to the case, and
the plurality of connecting terminals are positioned on the three-phase terminals when the attachment part is attached to the part of the case.

14. A power converter comprising:
a power module configured to convert direct-current electric power to three-phase alternating-current electrical power, the power module being configured to output the three-phase alternating-current electrical power from three-phase terminals;
a three-phase bus bar that has a plurality of connecting terminals and a load terminal, the plurality of connecting terminals being connected to the power module, and the load terminal being formed in a crossing direction with respect to the plurality of connecting terminals and configured to connect to an external load;
a bus bar holder configured to hold the three-phase bus bar; and
a case that has a through hole through which the three-phase bus bar extends, the case being configured to accommodate the power module, the three-phase bus bar, and the bus bar holder, wherein
the three-phase terminals are arranged side-by-side on the power module,
the plurality of connecting terminals are respectively formed on the three-phase bus bar and configured to be positioned on the three-phase terminals when the three-phase bus bar and the power module are accommodated in the case,
the bus bar holder further has an attachment attached to the case to fix the plurality of connecting terminals and the load terminal to the case,
the plurality of connecting terminals are positioned the three-phase terminals when the attachment is attached to part of the case,
the load terminal is configured such that the three-phase bus bar is inserted into the through hole and exposed to an outside of the case,
the case has a cooling-medium flow channel structured to permit cooling medium to flow through the cooling-medium flow channel to cool the power module, and
the through hole is formed at a region of the case separate from the cooling-medium flow channel.

15. The power converter according to claim 14, wherein:
the case is formed to have a box-shape having a bottom portion in which the power module, the three-phase bus bar, and the bus bar holder are provided, and
the cooling-medium flow channel is formed in the bottom portion.

16. The power converter according to claim 14, further comprising:
a DC/DC converter provided to face the three-phase bus bar so as to sandwich the power module therebetween, the DC/DC converter being configured to convert direct-current voltage supplied from a power storage apparatus; and
a charger provided to face the power module so as to sandwich the DC/DC converter therebetween, the charger being configured to convert three-phase alternating-current electrical power, which is supplied via an external connector, to direct-current electric power, and the charger being configured to charge the power storage apparatus.

17. The power converter according to claim 16, wherein:
the cooling medium flowing through the cooling-medium flow channel is discharged to the outside after cooling the power module, the DC/DC converter, and the charger.

18. The power convener according to claim 16, further comprising:
a capacitor module attached to the case so as to straddle over the DC/DC converter, the capacitor module being configured to have a capacitor that smooths voltage supplied from the power storage apparatus.

* * * * *